United States Patent [19]
Mastin

[11] 3,939,468
[45] Feb. 17, 1976

[54] DIFFERENTIAL CHARGE AMPLIFIER FOR MARINE SEISMIC APPLICATIONS

[75] Inventor: Robert H. Mastin, Dallas, Tex.

[73] Assignee: Whitehall Corporation, Richardson, Tex.

[22] Filed: Jan. 8, 1974

[21] Appl. No.: 431,723

[52] U.S. Cl. .......................... 340/7; 340/17; 330/7
[51] Int. Cl.² ............................................ G01V 1/00
[58] Field of Search ........................ 330/7; 340/7, 17

[56] References Cited
UNITED STATES PATENTS

| | | | |
|---|---|---|---|
| 2,465,696 | 3/1949 | Paslay | 340/7 R |
| 3,371,739 | 3/1968 | Pearson | 340/7 R |

Primary Examiner—Richard A. Farley
Assistant Examiner—S. C. Buczinski
Attorney, Agent, or Firm—Mason, Fenwick & Lawrence

[57] ABSTRACT

A differential charge amplifier for use in towed marine seismic streamers and the like involving towed hydrophone arrays wherein the hydrophone outputs are conducted by long twisted pairs of leads to signal processing equipment, the differential charge amplifier including operational amplifiers connected to form charge amplifier stages having resistance-capacitance feedback circuits and a differential amplifier stage coupled to the charge amplifier outputs providing cancellation of common mode signals.

29 Claims, 9 Drawing Figures

$$\text{GAIN} = 2\,\frac{C_1}{C_2}$$

$$\text{LOW FREQ. RESPONSE} = \frac{1}{2\pi C_2 R_3}$$

$$\text{HIGH FREQ. RESPONSE} = \frac{1}{2\pi C_1 (R_1 + R_2)}$$

$C_1$ = HYDROPHONE CAPACITANCE

DIFFERENTIAL CHARGE AMPLIFIER FOR MARINE SEISMIC APPLICATIONS

BACKGROUND AND OBJECTS OF THE INVENTION

The present invention relates in general to charge amplifier circuitry for use with capacitive transducers arranged for example in a towed hydrophone array as in a marine seismic streamer or an anti-submarine warfare streamer or the like, and more particularly to a differential charge amplifier for use in marine seismic streamer or anti-submarine warfare streamer applications involving towed hydrophone arrays for passive underwater detection, wherein the hydrophones drive long twisted pairs of leads or conductors for transmission through the streamer to shipboard signal processing stations.

Heretofore, a number of marine seismic detection cables or streamers, the terms being used interchangeably, have been devised for making seismic surveys of terrestrial sub-surface structures disposed beneath sea water. In general, the marine seismic streamers have included a lead-in cable and a long series of serially connected active streamer sections each usually formed of an oil filled plastic tube surrounding an array of hydrophones, strain cables, structural spacers, transformers, and mechanical and electrical leads or connectors, such as, for example the marine seismic streamer sections of the type disclosed in U.S. Pat. No. 2,465,696 issued Mar. 29, 1949 to Leroy C. Paslay or U.S. Pat. No. 3,371,739 issued Mar. 5, 1968 to Raymond H. Pearson. Inactive streamer sections are also often interspersed in the string of serially connected so called "active" sections having the sound pressure responsive hydrophones. Such marine seismic streamers or cables may in many cases be a mile or more in length, a typical streamer system being about 7,000 with each section being typical a hundred feet or more in length. During seismic survey or prospecting operations, such streamers are towed by the seismic survey vessel at a selected depth below the surface of the sea, by any of several conventional means for maintaining the seismic cable at the desired underwater depth. Typically, the cables may be provided with a plurality of weights at spaced intervals to make them negatively buoyant and flotation means or ring boom means may be associated with the cable to assist in maintaining it at the desired depth. Alternatively, regulation of the buoyancy of the streamer may be achieved by introducing into the streamer or withdrawing from it a fluid which will vary the buoyancy of the streamer, or paravane type structures may be used having adjustable diving planes which maintain the streamer at the appropriate depth.

Similarly, long towed hydrophone arrays have been employed as underwater listening devices for detecting submarines or underwater vessels used in warfare, such towed hydrophone arrays being employed as passive underwater detection systems in what are referred to as ASW streamers.

In towed underwater hydrophone arrays of either of the types described above, piezoelectric ceramic capacitance transducers are customarily used as hydrophones to respond to the underwater sound pressure waves or phenomena to be detected by the hydrophones and convert such phenomena to electrical information. Such transducers produce an output voltage that is proportional to the applied acoustic pressure and present day streamer applications typically employ up to one hundred groups of hydrophones towed in a single streamer, spaced from 500 to 10,000 feet behind a marine geophysical boat. In order to transmit the hydrophone output signals or output voltages to the signal processing equipment on the geophysical boat or the towing vessel, it has been the practice to connect a transformer to each hydrophone group as means of overcoming the change of signal loss over such a long line with variations in the cable length. In such a streamer systems involving transformers connected to the hydrophone groups, the transformer basically lowered the source impedance allowing the hydrophone group to drive a long twisted pair of cables for coupling the output signals from the hydrophone group to the processing equipment on the towing vessel. Such a system, however, has well recognized disadvantages, in that the output voltage from the hydrophone group is substantially reduced, in some cases by as much as 10 to 1. While a typical multidyne hydrophone may have an output of about 56 uv/ubar, at the transformer output in such a system this may be reduced to about 5–10 uv/ubar depending on the number of phones and transformer design, thus resulting in a serious loss of sensitivity of the hydrophone system and rendering it extremely difficult to obtain adequate signal-to-noise ratios where long lines are required to conduct the signals from a streamer to the towing vessel.

Charge amplifiers have been previously employed for certain types of transducers, such as capacitance microphones and some types of accelerometers, where the transducers operate on the principle of conversion of some mechanical, thermal, chemical, etc. phenomenon to an equivalent electrical charge. To complete the charge amplifier circuit, an Operational Amplifier is connected with its inverting input or negative input connected to the transducer, and with a feedback circuit including a capacitor and a resistor in parallel connected between the output and the negative input of the Operational Amplifier. It has been found that such a circuit has the desirable property of being virtually independent of shunt capacitance across the input of the Operational Amplifier. When using negative feedback, the Operational Amplifier will work in such a manner as to keep the two inputs at the same potential, and since the + input is connected to ground, the − input is also kept at ground potential by the negative feedback. Therefore, adding shunt capacitance across the input has no effect because no voltage is developed across the shunt capacitance.

Such a conventional charge amplifier, if employed in a towed hydrophone array application of the type described, wherein piezoelectric ceramic capacitance transducers are used as hydrophones, would seem to offer hope of eliminating the use of transformers associated with the hydrophone groups and the resultant loss of sensitivity, because of the independence of the charge amplifier of shunt capacitance across the input. However, if a charge amplifier were connected to the hydrophone transducers in conventional fashion, a number of problems are presented rendering the conventional charge amplifier apparently unsuitable for such an application, including particularly the property that, because of the unbalanced input present in the basic conventional operational charge amplifier circuit, the circuit has no common mode signal rejection capability.

An object of the present invention is the provision of a differential charge amplifier circuit to be connected to a group of hydrophones in a towed hydrophone array employing long twisted pairs of cable leads or conductors for conducting the electrical signals to the towing vessel, which circuit allows the array of hydrophones to drive the long twisted pairs of leads without the need for a transformer and the resulting loss of sensitivity.

Another object of the present invention is the provision of the novel differential charge amplifier circuit for use with hydrophones of a towed array of hydrophones of the piezoelectric ceramic capacitance transducer type, arranged for example in a towed underwater marine streamer for seismic or ASW applications and the like, which provides a balanced input to the differential amplifier providing common mode signal rejection capability, and which provides good frequency response characteristics over the band of frequencies appropriate for seismic prospecting and ASW detection applications.

Another object of the present invention is the provision of a differential charge amplifier circuit as described in the immediately preceding paragraph, which minimizes changes in frequency response or phase shift resulting from electrical leakage in the streamer sections where the hydrophones are located or resulting from sea water intrusion and the like, minimizing the need for removal and replacement of the hydrophone sections.

Other objects, advantages and capabilities of the present invention will become apparent from the following detailed description, taken in conjunction with the accompanying drawings illustrating a preferred embodiment of the invention.

DETAILED DESCRIPTION OF A PREFERRED EMBODIMENT

Figure 1:
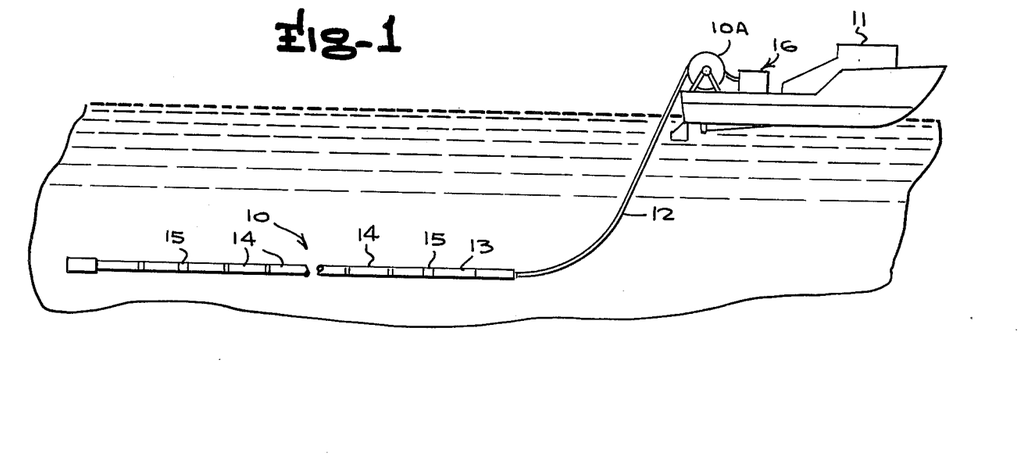
FIG. 1 is a diagrammatic view of a marine seismic streamer having a towed hydrophone array, showing a type of towed streamer application in which the differential charge amplifier of the present invention may be used.

Referring to the drawings, wherein like reference characters designate corresponding parts throughout the several figures, there is illustrated in FIG. 1 in diagrammatic form a seismic detection streamer cable 10 coupled to a drum or similar device diagrammatically indicated at 10A on a towing vessel 11, so that the seismic detection streamer can be towed in normal fashion at a preselected depth through fresh water or sea water by the towing vessel 11. It is to be understood that the streamer may be either a seismic detection streamer to be employed in seismic prospecting, or may be a passive detection streamer for detecting sounds from underwater equipment or vessels as used in anti-submarine warefare detection systems and the like. The detection streamer 10 includes a lead-in cable 12 which may have fairings and contains, typically, the signal wires leading from hydrophones in what are termed active sections of the streamer, as well as strain cables and other connection elements required for operation. The lead-in cable typically is followed by, for example, an elastic section 13 and the active sections 14, separated at desired locations in a conventional streamer by inactive streamer sections 15 interspersed between the active sections 14. Conventional depth control means are associated with the streamer, which may take the form of paravane depth control devices or pressure sensing means for regulating the buoyancy of the streamer in a known manner to maintain the desired depth. The general method of operation of such detection streamers when employed in seismic exploration is described in the prior Paslay U.S. Pat. No. 2,465,696 and a typical construction of the streamer sections may be similar to that illustrated in the prior Pearson U.S. Pat. No. 3,371,739. The streamer sections 14, many of which are arranged in serial relation along the streamer cable and are coupled together by various types of coupling devices, typically may form a streamer of about 1 mile or more in length, with each of the active streamer sections containing an array or group of hydrophones spaced in a selected arrangement along the associated active streamer sections. Heretofore, the outputs of the hydrophones in a single section have been typically connected in parallel to an impedance matching transformer to couple the electrical voltage signals from the hydrophones produced responsive to the acoustic pressure variations sensed by the hydrophones to signal processing equipment, indicated diagrammatically by the reference character 16, on the marine geophysical towing vessel 11. The streamer formed by the elastic section 13, the active sections 14, and the inactive sections 15, may be spaced from about 500 to 10,000 feet behind the geophysical vessel 11, employing a very long lead-in cable 12, housing the signal wires through which the electrical voltage signals from the hydrophones must be conducted to the processing equipment 16, as well as the strain cables and other connection elements.

Figure 2:
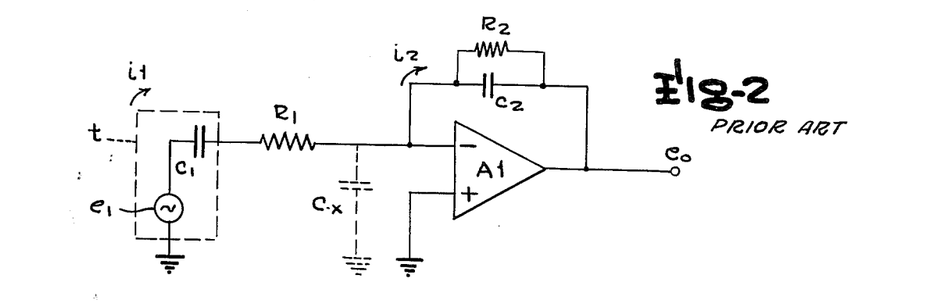
FIG. 2 is a block diagram of a conventional charge amplifier using an operational amplifier connected to the equivalent circuit of a capacitance transducer.

A conventional prior art charge amplifier as used heretofore in connection with capacitive transducers such as piezoelectric accelerometers and the like is shown in block diagram form in FIG. 2. The transducer is represented by the broken line block, indicated by the reference character $t$. The equivalent circuit of the transducer $t$ can be represented by a low impedance voltage source $e_1$ and capacitor $C_1$ in series. The charge on this circuit is $Q = C_1 e_1$, and either a change of capacitance or a change or voltage will cause a change in charge. The resistance $R_1$ represents the line resistance from the transducer $t$ to the operational amplifier $A_1$, the capacitance $C_x$ shown in broken lines represents the shunt capacitance along the lines from the transducer to the amplifier input. An analysis of the circuit will reveal that because $i_1 = i_2$, since no current is assumed to flow into the negative input terminal of the amplifier $A_1$, the following response equation applies:

$$\frac{e_o}{e_1} = -\frac{C_1}{C_2}.$$

This response equation relates the output voltage both to a change in capacitance and to a change in the equivalent series voltage. Note that either or both, a change in $C_1$, or a change in $e_1$, will cause a change in output voltage $e_o$, because either will change in charge . . . hence, the name "charge amplifier".

The gain in the charge amplifiers circuit is the ratio of the transducer capacitance $C_1$ to the amplifier feedback capacitance $C_2$. This circuit has the desirable feature of being independent of shunt capacitance across the input of the amplifier. When using negative feedback, the operational amplifier will work in such a manner as to keep the two inputs at the same potential. Since the + input is connected to ground, the − input is also kept at ground potential by the negative feedback. Therefore, adding shunt capacitance across the input has no effect because no voltage is developed across the shunt $C_x$.

The resistance $R_1$ limits the high frequency response of the amplifier to $$f_H = \frac{1}{2\pi R_1 C_1}.$$

The feedback resistance $R_2$ is required to produce a DC input bias current path for the negative input to the amplifier $A_1$. The parallel combination of $R_2$ and $C_2$ limits the low frequency response of the circuit to $$f_L = \frac{1}{2\pi R_2 C_2}.$$

Because a large value is required for the resistance $R_2$ (typically in the megohm range,) for low frequency operation, amplifiers with low noise and bias currents need to be used. Also, because of the unbalanced input, this circuit has no common mode signal rejection capability. The differential charge amplifier circuit of the present invention was developed to overcome these limitations and allow the use of a charge type amplifier on long unshielded twisted pair cables.

Figure 3:
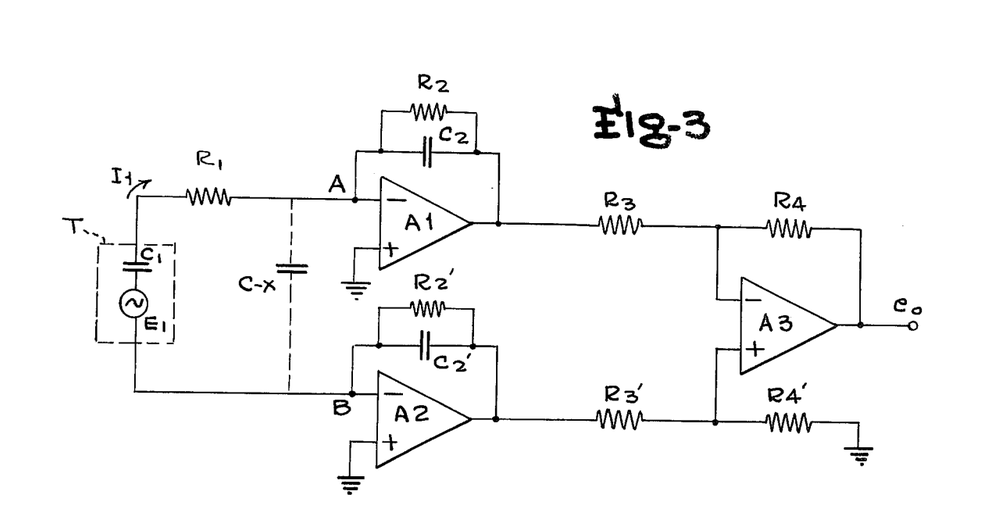
FIG. 3 is a block diagram of a differential charge amplifier connected to an equivalent circuit representing a hydrophone or hydrophone group driving a long twisted pair of leads or conductors, embodying the present invention.

Referring to FIG. 3, illustrating the differential charge amplifier circuit in block diagram form, the hydrophone or hydrophones of the towed hydrophone array, such as piezoelectric ceramic capacitance hydrophones in the towed underwater detection streamer, such as a seismic or ASW streamer, are represented by the broken line block T, and the equivalent circuit of the hydrophone is represented by the voltage source E1 and capacitor C1 in series. The line resistance from the hydrophone T to the operational amplifiers A1 and A2 is represented by the resistance R1, and the parallel combination of resistance and capacitance in the feedback circuits for the operational amplifiers A1 and A2 is indicated by R2 and C2 or R2' and C2' respectively. The input current I1 produced by the voltage source E1 of the hydrophone flows into node A and out of node B. Since this current is the same at both nodes A and B, the output voltage of operational amplifier A1 and A2 is the same magnitude but opposite in polarity. The gain of amplifiers A1 and A2 is $$\frac{C1}{C2}.$$

The differential amplifier A3 has a gain of $$\frac{R4}{R3}.$$

The total circuit gain equals $$2 \times \frac{C1}{C2} \times \frac{R4}{R3}.$$

If the feedback capacitors C2 and C2' are equal, common mode current signals appearing at the input nodes A and B are cancelled by the differential amplifier A3. The resistance R1 represents the round trip line resistance in the twisted pair of leads extending from the hydrophone to the differential amplifier circuit and the high frequency response of the circuit is determined by $$f_H = \frac{1}{2\pi R1 C1}.$$

The high frequency cutoff is also related to the distributed effect of the line resistance R1 and the shunt line capacitance Cx as with the previously described prior art charge amplifier. The shunt capacitance has no effect when there is zero voltage across the effective shunt capacitor Cx, which is true only, in a precise sense, at the amplifier input nodes or terminals A and B. In practical application, the round trip line resistance R1 and the shunt capacitance Cx are distributed along the total length of the cable, and therefore small increasing voltages are developed across the distributed shunt capacitance Cx by the current I1 and distributed line resistance R1. In a twisted pair cable 10,000 feet long, the cutoff frequency is still above the seismic band, and the low frequency cutoff is determined by the equation $$f_L = \frac{1}{2\pi R2 C2}.$$

Figures 4, 7:
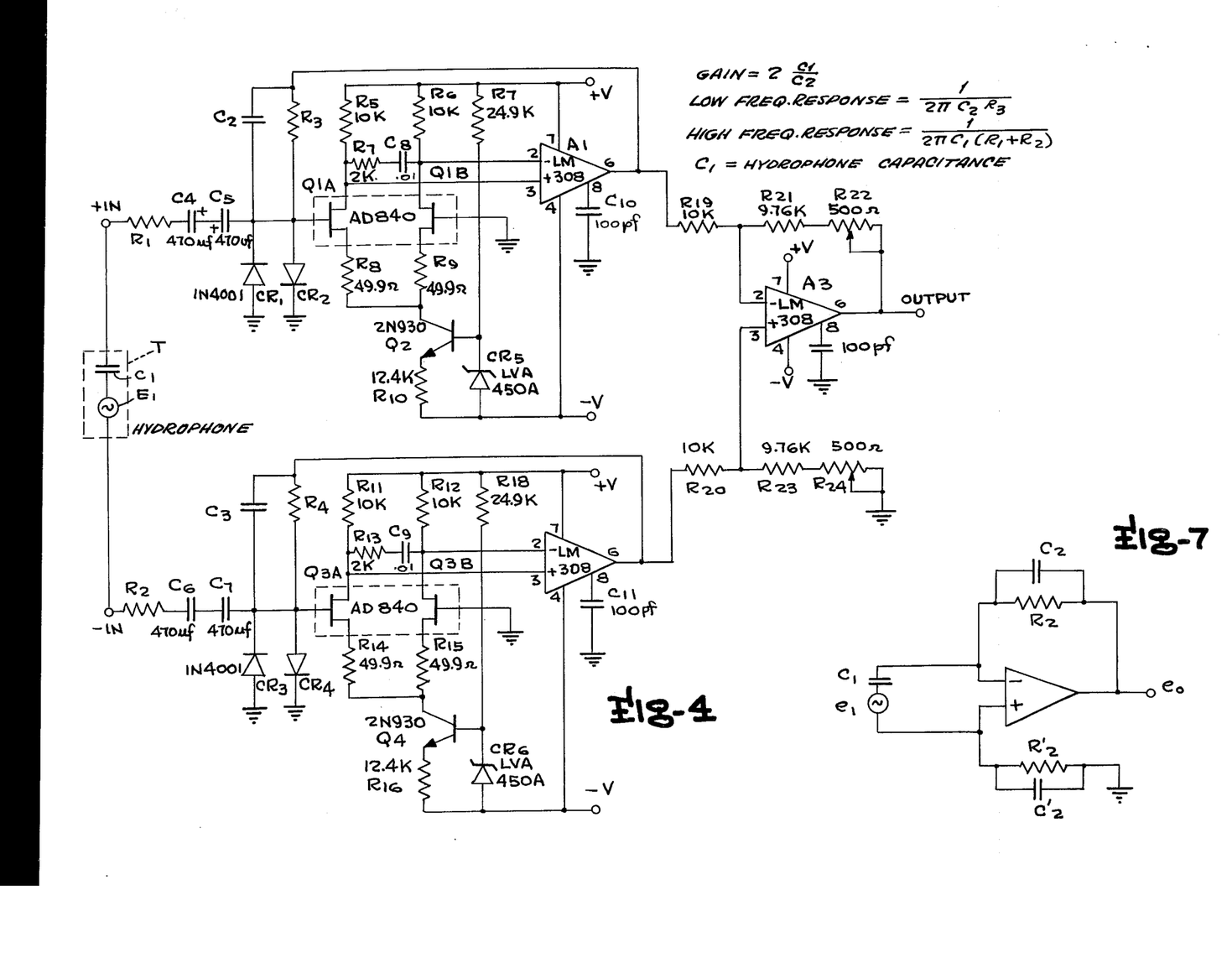
FIG. 4 is a schematic diagram of a differential charge amplifier connected to the equivalent circuit of a piezoelectric ceramic hydrophone and a long twisted-pair line to the hydrophone, showing a satisfactory embodiment of an arrangement of transistors amplifiers, and associated components.
FIG. 7 is a block diagram of an alternative differential charge amplifier which may be used instead of the circuit of FIG. 3.

FIG. 4 illustrates in schematic form the detail schematic circuit for a practical embodiment of a differential charge amplifier used with a towed hydrophone array in accordance with the present invention. The hydrophone, or group of hydrophones, to be connected by the long twisted pair of leads to the differential charge amplifier is again indicated by the broken line block T and represented by the capacitor C1 and voltage source E1 as the equivalent circuit for the hydrophone. In FIG. 4, the transistors Q1 and Q2, the amplifier A1 and the associated components function as the block diagram operational amplifier A1 of FIG. 3. The transistors Q3 and Q4, amplifier A2, and the associated components function as the block diagram operational amplifier A2 in FIG. 3. The amplifier A3 and its associated components in FIG. 4 function as the block diagram amplifier A3 in FIG. 3. Since the operation of the circuitry associated with the amplifier A2 is identical to the function of the circuitry associated with amplifier A1, the circuitry of amplifier A2 will not be explained in detailed.

Resistors R1 and R2, appearing in upper and lower input circuits, represent resistance of wire in each half of the twistedpair line to the hydrophone T. The hydrophone capacitance is shown as C1. Capacitors C4 and C5 form a non-polarized capacitor which passes low-frequency AC signals, but block DC signals. The maximum input voltage is limited to approximately 0.6 volt peak by diodes CR1 and CR2 for protection of the circuit. The input signal is applied to the gate of field-effect transistor Q1A, which forms one-half of a differential amplifier. Resistors R5 and R6 are the load resistors for this amplifier, and bias current is supplied by transistor Q2 through resistors R8 and R9. Bias current is fixed by the constant voltage from resistor R17 and zener diode CR5 in the base circuit of transistor Q2, so transistor Q2 collector current is constant. As input signal voltage becomes more positive, source/drain current in transistor Q1A increases. Consequently, source/drain current in transistor Q1B decreases. The result is a rising voltage at the minus input of operational amplifier A1, and a decreasing voltage at the positive input of amplifier A1. Resistor R7 and capacitor C8 limit the output frequency of differential amplifier Q1. The increasing input signal causes reduced output from amplifier A1 and, at the same time, increased output from operational amplifier A2.

Amplifier A1 output is coupled back to the positive input through resistor R3 and capacitor C2. Amplifier A2 output is coupled back through to the negative input through resistor R4 and capacitor C3. The gain of amplifier A1 is set by the ratio of the hydrophone capacitance C1 to the feedback capacitor C2. Resistor R3 provides a DC bias current path for the gate of transistor Q1A. Capacitor C6 is for frequency compensation of operational amplifier A1. Use of field-effect transistor input stages for amplifiers A1 and A2 reduces the input bias current and noise such that resistors R3 and R4 can be made very large for low frequency response without increasing amplifier noise and DC temperature drift. Output from amplifiers A1 and A2 is routed to differential-input amplifier A3 through resistors R19 and R20.

Amplifier A3 and resistors R19, R20, R21, R22, R23 and R24 form a differential amplifier which responds only to a differential voltage as produced by the hydrophone. Common-mode voltage introduced into the twisted input wire are rejected by amplifier A3. Variable resistors R22 and R24 are used to set the gain and common-mode rejection of amplifier A3. Capacitor C12 provides frequency compensation for amplifier A3.

FIG. 7 illustrates in block diagram form another differential charge amplifier circuit which may be used and provides the desired common mode signal rejection. A standard prior art charge amplifier such as that shown in FIG. 2 differs significantly in operation from the circuit of FIG. 7 because the charge amplifier of FIG. 2 does not have common mode signal rejection. The FIG. 2 type circuit provides an output from the amplifier stage A1 which is proportional to the voltage $e_1$ across the low impedance voltage source in the equivalent circuit of the transducer. The circuit of FIG. 7 comprises an operational amplifier, indicated by the triangle, like the operational amplifier A1 of FIG. 2, but includes resistors $R_2$ and $R'_2$ which provide a DC bias return path for the plus and minus inputs of the operational amplifier. These resistors provide functions similar to the resistors R4 and R4' of the circuit of FIG. 3. The two capacitors C2 and C'2 are equal, and thus common mode signals appearing at the two conductors are cancelled by the differential charge amplifier.

Figure 5A:
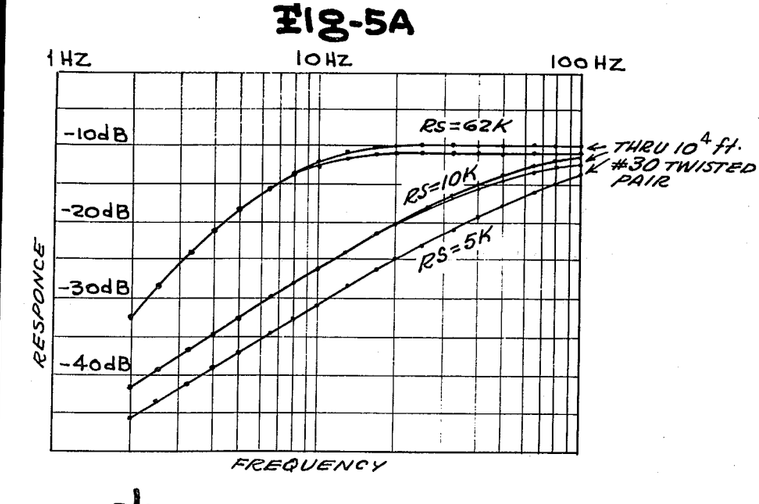
FIGS. 5A and 5B are graphic representations of measurements of frequency response characteristics plotted against frequency and phase shift plotted against frequency, respectively, for a conventional hydrophone array employing a conventional transformer circuit for driving long twisted leads.
Figure 5B:
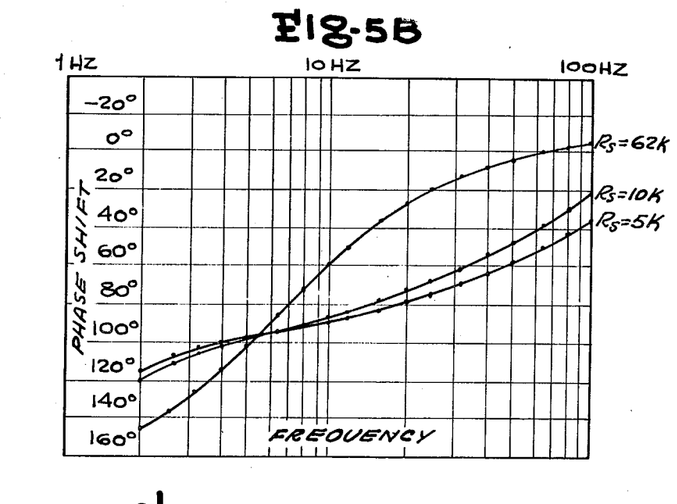
Figure 6A:
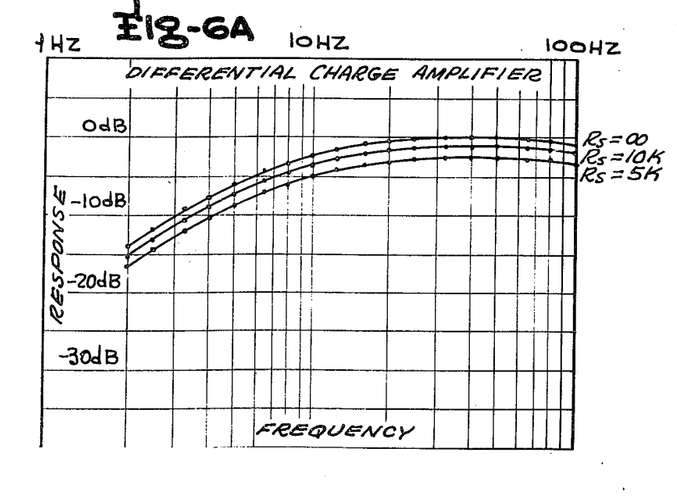
FIGS. 6A and 6B are graphic representations plotting frequency response characteristics and phase shift against frequency, respectively, for a hydrophone array employing a differential charge amplifier in accordance with the present invention.
Figure 6B:
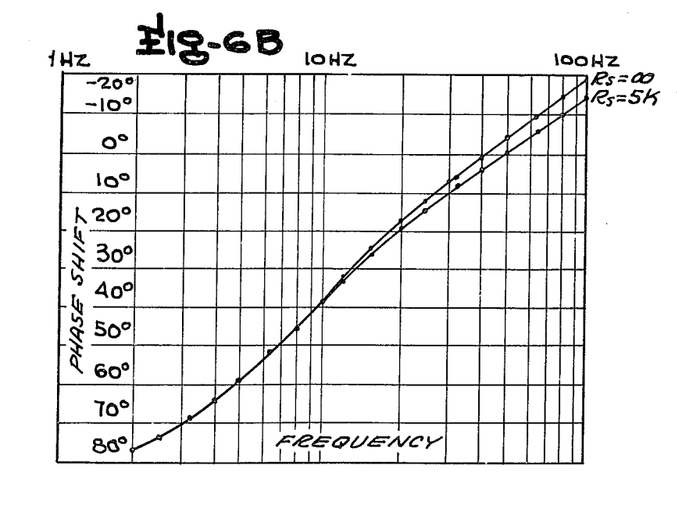

The use of the differential charge amplifier connected to the long twisted-pair of leads from the hydrophone or hydrophone group in the underwater detecting array in the streamer allows the hydrophones to drive the twisted-pair of leads and thereby transmit the electrical voltage signals from the hydrophones to the processing equipment on the towed vessel without the need for the transformer previously customarily employed in the seismic art. Also, additional significant advantages arise from the use of the differential charge amplifier in such an arrangement. It will be appreciated that accidental sea-water intrusion into the seismic streamer is a persistant problem. The shunting of the hydrophone or hydrophone group with reasonable values of resistance which would result from such sea-water intrusion severely reduces the frequency response in conventional seismic streamers with transformers between the hydrophones and the long twisted-pair of leads in the most critical frequency band for seismic devices. With a conventional transformer circuit, a loss of over 12 db at 10 Hz is possible with a 10 K ohm shunt resistance. The plot in FIG. 5A shows the significant change in frequency response which occurs with a conventional transformer circuit coupled to the hydrophones, for various values of resistance representing sea-water intrusion, as compared with the dramatic improvement in frequency response for similar leakage resistance across the hydrophone with the differential charge amplifier of the present invention, as plotted in FIG. 6A. Similarly, the dramatic improvement in phase shift with various leakage resistance across the hydrophone from sea-water intrusion or the like is shown by comparing the graphs of FIG. 5B for a conventional transformer circuit and FIG. 6B for a differential charge amplifier circuit of the present invention. It will be noted from FIG. 6A that the loss due to a 10K ohm shunt resistant across the hydrophone amounts to only 1.5 db and does not change the roll-off characteristics of the circuit. As shown in FIG. 6B, a 5K shunt resistance across the hydrophone produces no phase shift change below about 10 Hz and very little change above 10 Hz.

The upper curve in FIG. 5A with $R_s$ (the damping resistance) equal to 62K ohm is representative of a marine seismic towed array having a low frequency cutoff of 9 Hz (minus 3 db). The curve just below the upper curve on FIG. 5A shows the response through 10,000 feet of wire, and the other curves for leakage resistances of 10K and 5K ohms show the effect of extreme electrical leakage in the section where the hydrophones are located. In actual use this is not unusual, and when such leakages occur that hydrophone section must be removed and replaced. Comparing this with the data shown in FIG. 6A, using the differential charge amplifier, it would be noted that dramatic improvement in frequency response and phase shift with leakage resistance is realized, so that the change of frequency response or phase shift is not enough to require the expensive removal and replacement of the hydrophone section when such leakage resistances arise.

What is claimed is:

1. A marine hydrophone assembly for an elongated streamer designed to be towed underwater for passive underwater sound detection of acoustic pressure variations and the like, comprising a marine hydrophone of the capacitive transducer type responsive to varying acoustic pressure to produce a varying electrical charge output that is proportional to the acoustic pressure to which the hydrophone is subjected, an electrical conductor pair connected to the hydrophone to conduct the output from the hydrophone to signal processing equipment spaced therefrom, and a differential charge amplifier connected to the pair of conductors to respond to the varying electrical charge output from the hydrophone and produce amplified output voltage signals representative of said varying electric charge output, the differential charge amplifier comprising a pair of amplifier circuits each having negative and positive polarity inputs and an output arranged to form a pair of charge amplifier stages, each including a paralleled resistance-capacitance combination connected from the outputs of each of the respective amplifier circuits to the respective negative input thereof forming negative feedback circuits having equal capacitance to keep the two inputs of each respective amplifier circuit at the same potential, means connecting the pair of conductors respectively to the negative polarity inputs of the two respective amplifiers to feed said varying electric charge output thereto, and a differential amplifier having negative and positive polarity inputs and means connecting the outputs from said two charge amplifiers to said last-mentioned inputs for cancelling common mode signals appearing at the negative polarity inputs of said two charge amplifiers.

2. A marine hydrophone assembly as defined in claim 1, wherein a pair of operational amplifiers form said amplifier circuits and the positive polarity inputs for each of said pair of operational amplifiers are connected to ground potential and the negative feedback circuits associated with each of said operational amplifiers are operative to keep the negative polarity inputs of said operational amplifiers at ground potential, whereby variations in shunt capacitance between the negative polarity inputs of said two amplifiers has no effect on signal response since no voltage is developed across the two negative polarity inputs.

3. A marine hydrophone assembly as defined in claim 1, including means connected to said positive polarity inputs to said pair of amplifier circuits forming said charge amplifier stages to maintain them at a selected common potential level, and said negative feedback circuits associated with the respective amplifier circuits being operative to maintain the negative polarity inputs to said amplifier circuits at the same potential level as said positive input terminals by the negative feedback voltages coupled therethrough, thereby preventing any voltage from developing across shunt capacitance existing between the negative polarity inputs of the two amplifier circuits whereby adding shunt capacitance across said negative polarity inputs has negligible effect on signal characteristics of the charge amplifier stages.

4. A marine hydrophone assembly as defined in claim 1, wherein a pair of operational amplifiers form said amplifier circuits and connection of said electrical conductor pair to said negative polarity inputs of said operational amplifiers causes the same current to be produced at both said negative polarity inputs and causes the output voltages of said two operational amplifiers to be of the same magnitude and opposite in polarity.

5. A marine hydrophone assembly as defined in claim 3, wherein a pair of operational amplifiers form said amplifier circuits and connection of said electrical conductor pair to said negative polarity inputs of said operational amplifiers forming said charge amplifier stages causes the same current to be produced at both said negative polarity inputs and causes the output voltages of said two operational amplifiers to be of the same magnitude and opposite in polarity.

6. A marine hydrophone assembly as defined in claim 1, including a differential amplifier input stage associated with each of said amplifier circuits having a pair of field-effect transistors each forming one-half of a dual transistor device in the respective differential amplifier input stages, means connecting said varying electrical charge on said electrical conductor pair from said hydrophone to the gates of the field-effect transistors forming a corresponding one-half of the dual transistor devices in the differential amplifier input stages selectively paired with said amplifier circuits in said charge amplifier stages and means intercoupling the field-effect transistors forming the two halves of each of the dual transistor devices and connecting such devices to two amplifier sub-circuits in said amplifier circuits, the negative feedback fed through said feedback circuits being applied upstream of said dual transistor devices.

7. A marine hydrophone assembly as defined in claim 1, including a differential amplifier input stage associated with each of said amplifier circuits having a pair of field-effect transistors each forming one-half of a dual transistor device in the respective differential amplifier input stages, means connecting said varying electrical charge on said electrical conductor pair from said hydrophone to the gates of the field-effect transistors forming a corresponding one-half of the dual transistor devices in the differential amplifier input stages selectively paired with said amplifier circuits in said charge amplifier stages, means connecting the gate of another field-effect transistor in each of said differential amplifier input stages to a selected constant potential level, and means intercoupling the field-effect transistors forming the two halves of each of the dual transistor devices in the two differential amplifier input stages and connecting the collectors of the transistors forming each of the two halves of each respective dual transistor device with the negative and positive inputs respectively of an amplifier sub-circuit, and means connecting the output of said amplifier sub-circuit by said resistance-capacitance negative feedback circuit to the gate of said first-mentioned field-effect transistor associated with each of said charge amplifier stages.

8. A marine hydrophone assembly as defined in claim 7, including means connecting the emitters of each of said dual transistor devices in the emitter-collector circuits respectively of another pair of transistors having a zener diode connected to its base to maintain constant collector current in said lastmentioned pair of transistors.

9. A hydrophone hydrophoen assembly as defined in claim 8, including means connected to said positive polarity inputs to said pair of amplifier circuits forming said charge amplifier stages to maintain them at a selected common potential level, and said negative feedback circuits associated with the respective amplifier circuits being operative to maintain the negative polarity inputs to said amplifier circuits at the same potential level as said positive input terminals by the negative feedback voltages coupled therethrough, thereby preventing any voltage from developing across shunt capacitance existing between the negative polarity inputs of the two amplifier circuits whereby adding shunt capacitance across said negative polarity inputs has negligible effect on the charge amplifier stages.

10. A marine hydrophone assembly as defined in claim 3, including a differential amplifier input stage associated with each of said amplifier circuits having a pair of field-effect transistors each forming one-half of a dual transistor device in the respective differential amplifier input stages, means connecting said varying electrical charge on said electrical conductor pair from said hydrophone to the gates of the field-effect transistors forming a corresponding one-half of the dual transistor devices in the differential amplifier input stages selectively paired with said amplifier circuits in said charge amplifier stages, means connecting the gate of another field-effect transistor in each of said differential amplifier input stages to a selected constant potential level, and means intercoupling the field-effect transistors forming the two halves of each of the dual transistor devices in the two differential amplifier input stages and connecting the collectors of the transistors forming each of the two halves of each respective dual transistor device with the negative and positive inputs respectively of an amplifier sub-circuit, and means connecting the output of said amplifier sub-circuit by said resistance-capacitance negative feedback circuit to the gate of said first-mentioned field-effect transistor associated with each of said charge amplifier stages.

11. A marine hydrophone assembly as defined in claim 10, including means connecting the emitters of each of said dual transistor devices in the emitter-collector circuits respectively of another pair of transistors having a zener diode connected to its base to maintain constant collector current in said last-mentioned pair of transistors.

12. A marine seismic streamer assembly forming an elongated streamer designed to be towed underwater for passive underwater sound detection of acoustic pressure variations and production of electrical signals to be transmitted through a long pair of twisted conductors to signal processing equipment on a towing vessel, comprising an elongated seismic streamer formed of plural, serially interconnected streamer sections, a plurality of the streamer sections each containing an array of marine hydrophones of the capacitive transducer type each responsive to varying acoustic pressure to produce a varying electrical charge output that is proportional to the acoustic pressures to which the hydrophones in the array are subjected, means directly connecting the long pair of twisted electrical conductors to the hydrophone array at an input end of the conductors to conduct the varying electric charge output from the hydrophone array to the signal processing equipment, and a differential charge amplifier connected to an output end of said pair of conductors at a location remote from said hydrophone array to respond to the varying electrical charge output from the hydrophone array and produce amplified output voltage signals representative of said varying electrical charge output, the differential charge amplifier comprising a pair of charge amplifier stages forming a pair of parallel signal processing channels each having an operational amplifier therein having negative and positive polarity inputs and an output and parallel combinations of resistance and capacitance connected from the outputs of each respective charge amplifier to the respective negative inputs thereof forming negative feedback circuits to keep the two inputs of each respective charge amplifier at the same potential level, the capacitance in each of said negative feedback circuits being the same value, means connecting the pair of conductors to the negative polarity inputs of the two respective charge amplifiers, and a differential amplifier having negative and positive polarity inputs and means connecting the outputs from said two charge amplifiers to said last-mentioned inputs for cancelling common mode signals appearing at the negative polarity inputs of said two charge amplifiers.

13. A marine hydrophone assembly as defined in claim 12, including means connected to said positive polarity inputs to said pair of operational amplifiers forming said charge amplifier stages to maintain them at a selected common potential level, and said negative feedback circuits associated with the respective operational amplifiers being operative to maintain the negative polarity inputs to said operational amplifiers at the same potential level as said positive input terminals by the negative feedback voltages coupled therethrough, thereby preventing any voltage from developing across shunt capacitance existing between the negative polarity inputs of the two operational amplifiers whereby adding shunt capacitance across said negative polarity inputs has negligible effect on the charge amplifier stages.

14. A marine hydrophone assembly as defined in claim 12, wherein connection of said electrical conductor pair to said negative polarity inputs of said operational amplifiers forming said charge amplifier stages causes the same current to be produced at both said negative polarity inputs and causes the output voltage of said two operational amplifiers to be of the same magnitude and opposite in polarity.

15. A marine hydrophone assembly as defined in claim 12, including a pair of differential amplifier input stages respectively coupled to each of said operational amplifiers each having a dual transistor set formed of first and second halves providing a pair of field-effect transistors in the respective differential amplifier input stages, means connecting said varying electrical charge on said electrical conductor pair from said hydrophones to the gates of the field-effect transistors forming a first half of the dual transistor sets in the differential amplifier input stages selectively paired with the operational amplifiers forming said charge amplifier stages, and means intercoupling the field-effect transistors forming the two halves of each of the dual transistor sets and connecting both halves of each set to the two respective operational amplifiers, the negative feedback fed through said feedback circuits being applied to the inputs of said first halves.

16. A marine hydrophone assembly as defined in claim 12, including a pair of differential amplifier input stages respectively coupled to each of said operational amplifiers having a pair of field-effect transistors each forming a first half of a dual transistor set in the respective differential amplifier input stages, each said set having a second half intercoupled with its first half also forming a field-effect transistor, means connecting said varying electrical charge on said electrical conductor pair from said hydrophones to the gates of the field-effect transistors forming a said first half of the dual transistor sets in the differential amplifier input stages selectively paired with the operational amplifiers forming said charge amplifier stages, means connecting the gate of the second half field-effect transistor in each of said differential amplifier input stages to a selected constant potential level, and means connecting the collectors of the transistors forming each of the two halves of each respective dual transistor sets with the negative and positive inputs respectively of the associated operational amplifier and means connecting the output of said associated operational amplifier by said resistance-capacitance negative feedback circuit to the gate of said first half field-effect transistor associated with each of said charge amplifier stages.

17. A marine hydrophone assembly as defined in claim 16, including means connecting the emitters of each of the halves of said respective dual transistor sets in the emitter-collector circuits respectively of another pair of transistors having a zener diode connected to the base of each to maintain constant collector current in said last-mentioned pair of transistors.

18. A marine hydrophone assembly for passive under-water sound detection of acoustic pressure variations and production of electrical signals to be transmitted through a pair of twisted conductors to signal processing equipment at a processing station spaced from an underwater listening station comprising a marine hydrophone of the capacitive transducer type at the underwater listening station responsive to varying acoustic pressure to produce a varying electrical charge output that is proportional to the acoustic pressures to which the hydrophone is subjected, means directly connecting the pair of twisted electrical conductors to the hydrophone at an input end of the conductors to conduct the varying electric charge output from the hydrophone to the signal processing equipment, and a differential charge amplifier connected to an output end of said pair of conductors at the processing station remote from said hydrophone to respond to the varying electrical charge output from the hydrophone and produce amplified output voltage signals representative of said varying electrical charge output, the differential charge amplifier comprising a pair of charge amplifier stages forming a pair of parallel signal processing channels each having an operational amplifier therein having negative and positive polarity inputs and an output and parallel combinations of resistance and capacitance connected from the outputs of each respective charge amplifier to the respective negative inputs thereof forming negative feedback circuits to keep the two inputs of each respective charge amplifier at the same potential level, the capacitance in each of said negative feedback circuits being the same value, means connecting the pair of conductors to the negative polarity inputs of the two respective charge amplifiers, and a differential amplifier having negative and positive polarity inputs and means connecting the outputs from said two charge amplifiers to said last-mentioned inputs for cancelling common mode signals appearing at the negative polarity inputs of said two charge amplifiers.

19. A marine hydrophone assembly as defined in claim 18, including means connected to said positive polarity inputs to said pair of operational amplifiers forming said charge amplifier stages to maintain them at a selected common potential level, and said negative feedback circuits associated with the respective operational amplifiers being operative to maintain the negative polarity inputs to said operational amplifiers at the same potential level as said positive input terminals by the negative feedback voltages coupled therethrough, thereby preventing any voltage from developing across shunt capacitance existing between the negative polarity inputs of the two operational amplifiers whereby adding shunt capacitance across said negative polarity inputs has negligible effect on the charge amplifier stages.

20. A marine hydrophone assembly as defined in claim 18, wherein connection of said electrical conductor pair to said negative polarity inputs of said operational amplifiers forming said charge amplifier stages causes the same current to be produced at both said negative polarity inputs and causes the output voltages of said two operational amplifiers to be of the same magnitude and opposite in polarity.

21. A marine hydrophone assembly as defined in claim 18, including a pair of differential amplifier input stages respectively coupled to each of said operational amplifiers each having a dual transistor set formed of first and second halves providing a pair of field-effect transistors in the respective differential amplifier input stages, means connecting said varying electrical charge on said electrical conductor pair from said hydrophone to the gates of the field-effect transistors forming a first half of the dual transistor sets in the differential amplifier input stages selectively paired with the operational amplifiers forming said charge amplifier stages, and means intercoupling the field-effect transistors forming the two halves of each of the dual transistor sets and connecting both halves of each set to the two respective operational amplifiers, the negative feedback fed through said feedback circuits being applied to the inputs of said first halves.

22. A marine hydrophone assembly as defined in claim 18, including a pair of differential amplifier input stages respectively coupled to each of said operational amplifiers having a pair of field-effect transistors each forming a first half of a dual transistor set in the respective differential amplifier input stages, each said set having a second half intercoupled with its first half also forming a field-effect transistor, means connecting said varying electrical charge on said electrical conductor pair from said hydrophone to the gates of the field-effect transistors forming a said first half of the dual transistor sets in the differential amplifier input stages selectively paired with the operational amplifiers forming said charge amplifier stages, means connecting the gate of the second half field-effect transistor in each of said differential amplifier input stages to a selected constant potential level, and means connecting the collectors of the transistors forming each of the two halves of each respective dual transistor sets with the negative and positive inputs respectively of the associated operational amplifier and means connecting the output of said associated operational amplifier by said resistance-capacitance negative feedback circuit to the gate of said first half field-effect transistor associated with each of said charge amplifier stages.

23. A marine hydrophone assembly as defined in claim 22, including means connecting the emitters of each of the halves of said respective dual transistor sets in the emitter-collector circuits respectively of another pair of transistors having a zener diode connected to the base of each to maintain constant collector current in said last-mentioned pair of transistors.

24. A marine hydrophone assembly for passive underwater sound detection of acoustic pressure variations and production of electrical signals to be transmitted through a pair of ungrounded twisted conductors to signal processing equipment at a processing station spaced from an underwater listening station comprising a marine hydrophone of the capacitive transducer type at the underwater listening station responsive to varying acoustic pressure to produce a varying electrical charge output that is proportional to the acoustic pressures to which the hydrophone is subjected, means directly connecting the pair of twisted electrical conductors to the hydrophone at an input end of the conductors to conduct the varying electric charge output from the hydrophone to the signal processing equipment, and a differential charge amplifier coupled to an output end of said pair of conductors at the processing station remote from said hydrophone to respond to the varying electrical charge output from the hydrophone and produce amplified output voltage signals representative of said varying electrical charge output, the differential charge amplifier comprising an operational amplifier having negative and positive polarity ungrounded inputs and an output, circuit means providing a negative feedback circuit comprising a parallel combination of resistance and capacitance coupling feedback voltage to the negative input of the operational amplifier to form a charge amplifier circuit having the property of operating substantially independent of shunt capacitance variations across its input, means coupling signals from said pair of conductors to the two inputs of the operational amplifier, and a branch circuit having a parallel combination of resistance and capacitance connected between said positive polarity input and electrical ground and having the same resistance and capacitance values as said negative feedback circuit, said last-mentioned branch circuit and said negative feedback circuit being connected directly to the positive and negative polarity inputs respectively of said operational amplifier for causing cancellation of common mode signals appearing at the inputs of said operational amplifier.

25. A seismic detection system for geophysical prospecting and the like by detection of acoustic pressure variations forming seismic signals and production of electrical signals to be transmitted through a pair of ungrounded twisted conductors to signal processing equipment at a processing station spaced from a seismic signal detection station, comprising a seismic sensor of the capacitive transducer type at the detection station responsive to varying acoustic pressure to produce a varying electrical charge output that is proportional to the acoustic pressures to which the sensor is subjected, means directly connecting the pair of twisted electrical conductors to the sensor at an input end of the conductors to conduct the varying electric charge output from the sensor to the signal processing equipment, and a differential charge amplifier coupled to an output end of said pair of conductors at the processing station remote from said sensor to respond to the varying electrical charge output from the sensor and produce amplified output voltage signals representative of said varying electrical charge output, the differential charge amplifier comprising an operational amplifier having negative and positive polarity ungrounded inputs and an output, circuit means providing a negative feedback circuit comprising a parallel combination of resistance and capacitance coupling feedback voltage to the negative input of the operational amplifier to form a charge amplifier circuit having the property of operating substantially independent of shunt capacitance variations across its input, means coupling signals from said pair of conductors to the two inputs of the operational amplifier, and a branch circuit having a parallel combination of resistance and capacitance connected between said positive polarity input and electrical ground and having the same resistance and capacitance values as said negative feedback circuit, said lastmentioned branch circuit and said negative feedback circuit being connected directly to the positive and negative polarity inputs respectively of said operational amplifier for causing cancellation of common mode signals appearing at the inputs of said operational amplifier.

26. A seismic detection system for geophysical prospecting by sound detection of acoustic pressure variations forming seismic signals and production of electrical signals to be transmitted through a pair of twisted conductors to signal processing equipment at a processing station spaced from a seismic signal detection station comprising a seismic sensor of the capacitive transducer type at the detection station responsive to varying acoustic pressure to produce a varying electrical charge output that is proportional to the acoustic pressures to which the sensor is subjected, means directly connecting the pair of twisted electrical conductors to the sensor at an input end of the conductors to conduct the varying electric charge output from the sensor to the signal processing equipment, and a differential charge amplifier connected to an output end of said pair of conductors at the processing station remote from said sensor to respond to the varying electrical charge output from the sensor and produce amplified output voltage signals representative of said varying electrical charge output, the differential charge amplifier comprising a pair of charge amplifier stages forming a pair of parallel signal processing channels each having an operational amplifier therein having negative and positive polarity inputs and an output and parallel combinations of resistance and capacitance connected from the outputs of each respective charge amplifier to the respective negative inputs thereof forming negative feedback circuits to keep the two inputs of each respective charge amplifier at the same potential level, the capacitance in each of said negative feedback circuits being the same value, means connecting the pair of conductors to the negative polarity inputs of the two respective charge amplifiers, and a differential amplifier having negative and positive polarity inputs and means connecting the outputs from said two charge amplifiers to said last-mentioned inputs for cancelling common mode signals appearing at the negative polarity inputs of said two charge amplifiers.

27. A seismic detection system as defined in claim 26, including means connected to said positive polarity inputs to said pair of operational amplifiers forming said charge amplifier stages to maintain them at a selected common potential level, and said negative feedback circuits associated with the respective operational amplifiers being operative to maintain the negative polarity inputs to said operational amplifiers at the same potential level as said positive input terminals by the negative feedback voltages coupled therethrough, thereby preventing any voltage from developing across shunt capacitance existing between the negative polarity inputs of the two operational amplifiers whereby adding shunt capacitance across said negative polarity inputs has negligible effect on the charge amplifier stages.

28. A seismic detection system as defined in claim 26, wherein connection of said electrical conductor pair to said negative polarity inputs of said operational amplifiers forming said charge amplifier stages causes the same current to be produced at both said negative polarity inputs and causes the output voltages of said two operational amplifiers to be of the same magnitude and opposite in polarity.

29. A seismic detection system as defined in claim 26, including a pair of differential amplifier input stages respectively coupled to each of said operational amplifiers each having a dual transistor set formed of first and second halves providing a pair of field-effect transistors in the respective differential amplifier input stages, means connecting said varying electrical charge on said electrical conductor pair from said sensor to the gates of the field-effect transistors forming a first half of the dual transistor sets in the differential amplifier input stages selectively paired with the operational amplifiers forming said charge amplifier stages, and means intercoupling the fieldeffect transistors forming the two halves of each of the dual transistor sets and connecting both halves of each set to the two respective operational amplifiers, the negative feedback fed through said feedback circuits being applied to the inputs of said first halves.

* * * * *